United States Patent
Dawson et al.

(10) Patent No.: US 9,285,289 B2
(45) Date of Patent: Mar. 15, 2016

(54) PRESSURE SENSOR WITH BUILT-IN CALIBRATION CAPABILITY

(71) Applicant: FREESCALE SEMICONDUCTOR, INC., Austin, TX (US)

(72) Inventors: Chad S. Dawson, Queen Creek, AZ (US); Peter T. Jones, Scottsdale, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 199 days.

(21) Appl. No.: 14/099,149

(22) Filed: Dec. 6, 2013

(65) Prior Publication Data

US 2015/0160089 A1   Jun. 11, 2015

(51) Int. Cl.
G01L 27/00 (2006.01)
H01L 41/08 (2006.01)
B81C 99/00 (2010.01)

(52) U.S. Cl.
CPC .............. *G01L 27/002* (2013.01); *B81C 99/003* (2013.01); *H01L 41/08* (2013.01); *B81B 2201/0264* (2013.01)

(58) Field of Classification Search
CPC ................. B81B 2201/0264; B81B 2207/015; G01L 19/0645; G01L 9/0054; G01L 13/026; G01L 15/00; G01L 19/148; G01L 27/005; G01L 9/0073
See application file for complete search history.

(56) References Cited

U.S. PATENT DOCUMENTS

| | | | |
|---|---|---|---|
| 5,672,808 A * | 9/1997 | Klauder et al. | 73/1.59 |
| 7,043,960 B1 | 5/2006 | Lueck | |
| 7,131,335 B2 * | 11/2006 | Textor | 73/716 |
| 7,137,301 B2 | 11/2006 | Grudzien | |
| 2004/0103724 A1 | 6/2004 | Takizawa et al. | 73/754 |
| 2006/0272422 A1 * | 12/2006 | Yoneda et al. | 73/724 |
| 2007/0243662 A1 * | 10/2007 | Johnson et al. | 438/106 |
| 2011/0156176 A1 * | 6/2011 | Huckabee et al. | 257/414 |
| 2011/0254107 A1 * | 10/2011 | Bulovic et al. | 257/415 |
| 2012/0012949 A1 * | 1/2012 | Winkler et al. | 257/415 |
| 2014/0116149 A1 * | 5/2014 | Diez et al. | 73/708 |

FOREIGN PATENT DOCUMENTS

EP   2022395 A1   2/2009
WO   2006/073770 A1   7/2006

* cited by examiner

*Primary Examiner* — David A Rogers
(74) *Attorney, Agent, or Firm* — Charlene R. Jacobsen (57) ABSTRACT

A MEMS pressure sensor (70) includes a sense cell (80), a test cell (82), and a seal structure (84). The test cell includes a test cavity (104), and the seal structure (84) is in communication with the test cavity, wherein the seal structure is configured to be breached to change an initial cavity pressure (51) within the test cavity (104) to ambient pressure (26). Calibration methodology (180) entails obtaining (184) a test signal (186) from the test cell prior to breaching the seal structure, and obtaining (194) another test signal (196) after the seal structure is breached. The test signals are used to calculate a sensitivity (200) of the test cell, the calculated sensitivity is used to estimate the sensitivity (204) of the sense cell, and the estimated sensitivity (204) can be used to calibrate the sense cell.

17 Claims, 5 Drawing Sheets

FIG. 1

PRIOR ART

FIG. 2

PRIOR ART

FIG. 3

PRIOR ART

PRESSURE SENSOR WITH BUILT-IN CALIBRATION CAPABILITY

TECHNICAL FIELD OF THE INVENTION

The present invention relates generally to microelectromechanical systems (MEMS) devices. More specifically, the present invention relates to estimating the sensitivity of a MEMS pressure sensor resulting from process variation.

BACKGROUND OF THE INVENTION

Microelectromechanical systems (MEMS) devices are semiconductor devices with embedded mechanical components. MEMS devices are used in a wide variety of products such as automobile airbag systems, control applications in automobiles, navigation, display systems, inkjet cartridges, and so forth. MEMS devices include, for example, pressure sensors, accelerometers, gyroscopes, microphones, digital mirror displays, micro fluidic devices, and so forth. A MEMS pressure sensor typically uses a pressure cavity and a membrane element, referred to as a diaphragm, that deflects under pressure. In some configurations, a change in the distance between two plates, where one of the two plates is the movable diaphragm, creates a variable capacitor to detect strain (or deflection) due to the applied pressure over an area.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

Critical systems in medical applications, alternative energy, engine control (e.g. gas and fuel inlet pressure), and automotive safety applications such as tire monitoring systems necessitate pressure sensors that deliver accurate and predictable output over their lifetime in order to track changes in operation before those changes become critical. Microelectromechanical systems (MEMS) pressure sensors are a commonly used pressure sensor technology due to their compact size, and due to their relatively inexpensive cost in high-production volumes.

With ongoing miniaturization, however, issues arise with MEMS pressure sensors. These issues are related to insensitivity, inaccuracy and signal drift. In particular, it is difficult to ensure that all MEMS devices are uniformly deposited or have identical geometries. Process variation on critical design parameters, such as the width of a MEMS pressure sensor diaphragm, can affect the sensitivity of a pressure sensor. For example, a small difference in the width of a MEMS pressure sensor diaphragm can result in a large difference in sensitivity, relative to the predetermined nominal, or design, sensitivity for the pressure sensor.

Due to process variation on critical design parameters, no two MEMS pressure sensor devices are exactly the same. Accordingly the sensitivity of each MEMS pressure sensor is typically calibrated during factory testing, before board mount, and/or after board mount to cancel out any signal incongruities due to process variation. A MEMS pressure sensor may be calibrated utilizing handler/tester equipment in an industrial fabrication environment. The handler/tester equipment may apply a known physical stimulus calibration signal to the pressure sensor. The output of the pressure sensor may be measured and compared with the value of the known calibration signal. The calibration information may then be used to correct subsequent pressure sensor readings. It is impractical to measure individual device parameters in an industrial fabrication environment, e.g. deflection profiles in relation to an externally applied force. That is, this traditional technique can be costly and time intensive due the need for a handler/tester equipment in order to impose the calibration signal.

Embodiments entail a MEMS pressure sensor that includes built-in calibration capability, methodology for fabricating the MEMS pressure sensor, and methodology for calibrating the MEMS pressure sensor. The pressure sensor includes multiple sense and test cells on a single die which are fabricated with the same design parameters and processes. Therefore, each of the sense and test cells ideally has the same sensitivity to an imposed pressure stimulus. A seal structure is in communication with one or more test cavities of one or more test cells. The seal structure is configured to be breached to change the pressure within the test cavities. A sensitivity of the test cells can be calculated by taking pressure readings before and after breaching the seal structure. Since the test and sense cells are assumed to have the same sensitivity, sense signals from the test cells may be utilized to estimate the sensitivity of the sense cells. Such a pressure sensor and methodology can reduce test costs and enable sensitivity estimation and associated sensor calibration without imposing a physical stimulus calibration signal.

Figure 1:
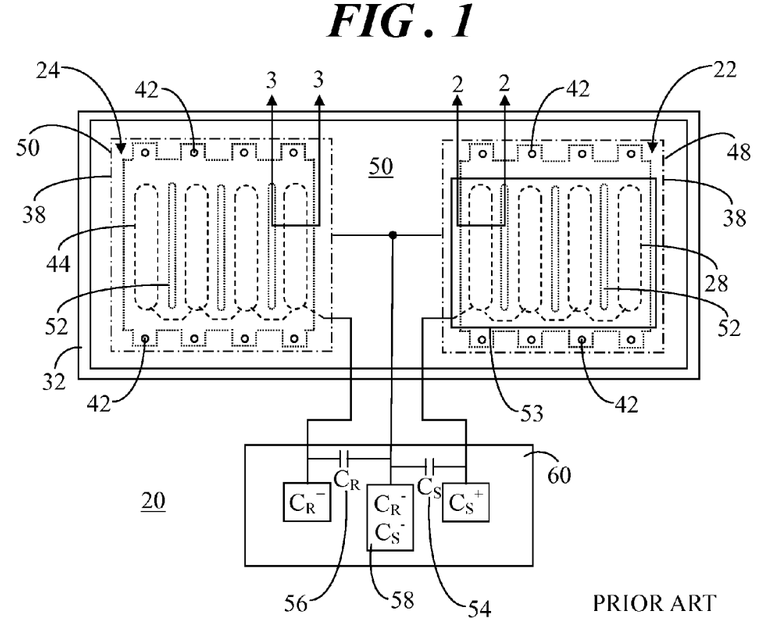
FIG. 1 shows a simplified top view of an exemplary pressure sensor.
Figure 2:
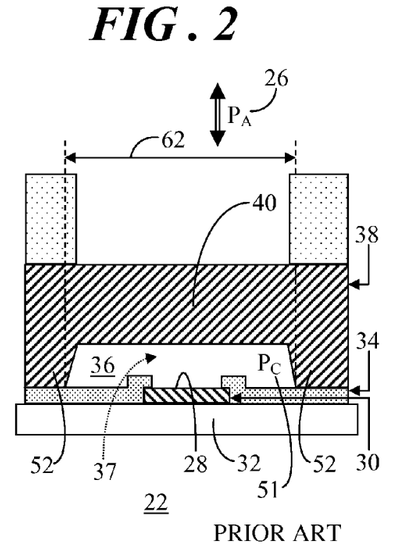
FIG. 2 shows a side sectional view of a sense structure of the pressure sensor along section lines 2-2 of FIG. 1.
Figure 3:
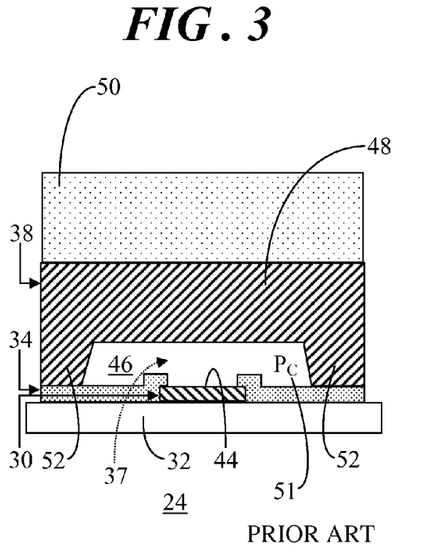
FIG. 3 shows a side sectional view of a reference structure of the pressure sensor along section lines 3-3 of FIG. 1.

Referring to FIGS. 1-3, FIG. 1 shows a simplified top view of an exemplary prior art pressure sensor 20, FIG. 2 shows a side sectional view of a portion of a sense structure 22 of pressure sensor 20 along section lines 2-2 of FIG. 1, and FIG. 3 shows a side sectional view of a portion of a reference structure 24 of pressure sensor 20 along section lines 3-3 of FIG. 1. In general, sense structure 22 is sensitive to ambient pressure, represented by an arrow 26 and labeled $P_A$ in FIG. 2. Conversely, reference structure 24 is largely insensitive to ambient pressure 26. Sense structure 22 includes one or more sense electrodes 28 formed in a structural layer 30 on a substrate 32 using the conventional operations of deposition, patterning, and etching.

An insulating layer, for example, a nitride layer 34 may be formed overlying at least portions of sense electrodes 28 and any exposed regions of the underlying substrate 32. Sense structure 22 includes a cavity 36 that may be formed by the conventional processes of deposition, patterning, and etching of a sacrificial layer 37, such as, polysilicate glass (PSG). After sacrificial layer 37 is suitably formed, another structural layer 38 is formed overlying sacrificial layer 37 and any exposed regions of the underlying nitride layer 34 and/or substrate 32. Structural layer 38 is processed to form one or more diaphragms 40 of sense structure 22 that are spaced apart from the underlying sense electrodes 28 by cavity 36. Thereafter, sacrificial layer 37 within cavity 36 may be removed via etch openings 42 per conventional processes. Sacrificial layer 37 is no longer present within cavity 36 in the fabricated sense structure 22 illustrated in FIG. 2. Hence a dotted line is directed from reference numeral 37 to the interior of cavity 36 to represent a location where sacrificial layer 37 was present prior to its removal.

Reference structure 24 is similar to sense structure 22. Accordingly, reference structure 24 includes one or more reference electrodes 44 formed in structural layer 30 on substrate 32, nitride layer 34 formed overlying at least portions of reference electrodes 44 and any exposed regions of the underlying substrate 32, and a cavity 46. Structural layer 38 is processed as discussed above and sacrificial material 37 within cavity 46 is removed to form one or more diaphragms 48 spaced apart from reference electrodes 44 by cavity 46. Again, sacrificial layer 37 is no longer present within cavity 46 in the fabricated reference structure 24 illustrated in FIG. 3. Hence, a dotted line is directed from reference numeral 37 to the interior of cavity 46 to represent a location where sacrificial layer 37 was present prior to its removal. A cap layer 50 is formed in contact with diaphragms 48. Cap layer 50 may be a relatively thick layer of, for example, tetraethyl orthosilicate (TEOS), which makes diaphragms 48 largely insensitive to pressure. As such, diaphragms 48 may be referred to hereinafter as reference electrodes 48.

A MEMS pressure sensor is typically fabricated so that the pressure within each of its cavities is below atmospheric pressure, and more particularly near vacuum. Accordingly, pressure sensor 20 is fabricated such that an initial cavity pressure 51, labeled $P_C$ in FIGS. 2 and 3, within each of cavities 36 and 46 is significantly less than ambient pressure 26. For example, initial cavity pressure 51 is approximately at vacuum.

In FIG. 1, elongated ovals illustrated using a dashed pattern represent electrodes 28 for sense structure 22. Dashed elongated ovals represent electrodes 44 for reference structure 24 as well. Additionally, a dotted pattern that includes narrow elongated ovals as well as a generalized rectangular shape surrounding electrodes 28 represents those portions of structural layer 38 (see also FIGS. 2-3) that couple to nitride layer 34 such as, for example, side walls 52 of pressure cavities 36, 46. That is, side walls 52 (see also FIGS. 2-3) are the portions of structural layer 38 that couple to nitride layer 34 so as to form the individual cavities 36, 46 of respective sense and reference structures 22, 24. Squares illustrated by a dash-dot pattern in FIG. 1 represent the outer edge of the capacitor plate, i.e., layer 38 in FIGS. 2 and 3, which includes diaphragms 40, 48 (best seen in FIGS. 2-3) of sense and reference structures 22, 24, respectively. It should be recalled that cap layer 50 is not formed over diaphragms 40 so that diaphragms 40 are sensitive to ambient pressure 26. Accordingly, a square 53 illustrated in a solid pattern in FIG. 1 represents a window, or absence of cap layer 50 so that diaphragms 40 are exposed to pressure 26. These variously patterned shapes do not represent the size of each element or feature relative to one another, but instead represent the stacked relationship of each of the elements or features.

In general, sense structure 22 forms a capacitor between each of diaphragms 40 and sense electrodes 28. That is, a sense capacitance 54, $C_S$, is formed between diaphragms 40 and sense electrodes 28 (i.e., the difference between $C_S^+$ and $C_S^-$) that varies in response to ambient pressure 26. Reference structure 24 also forms a capacitor between each of reference electrodes 48 and reference electrodes 44. Thus, a reference capacitance 56, $C_R$, is formed between reference electrodes 48 and 44 (i.e., the difference between $C_R^+$ and $C_R^-$) that does not vary in response to ambient pressure 26 due to the presence of cap layer 50. Diaphragms 40 and reference electrodes 48 may be interconnected to form a common node 58 between each of sense structure 22 and reference structure 24. A control circuit 60 is configured to measure the ratio of sense capacitance 54 to reference capacitance 56 (i.e., $C_S/C_R$). Higher pressure 26 increases sense capacitance 54, $C_S$, but has little effect on reference capacitance 56, $C_R$. Therefore the ratio of sense capacitance 54 to reference capacitance 56 (i.e., $C_S/C_R$) increases as pressure 26 increases. This value can be converted into a measure indicative of pressure 26.

In the illustrated embodiment, a critical dimension of sense structure 22 is a width 62 (see FIG. 2) of diaphragm 40. In order to obtain a desired sensitivity, a predetermined design value is established for width 62. However, process variation during, for example, deposition/patterning/etching of the sacrificial layer and/or during the release process where the sacrificial material within cavities 36 and 46 is removed can result in angled sidewalls and/or other dimensional variations that cause width 62 of diaphragm 40 to be greater than or less than the predetermined design value. The potential variation in width 62 can cause a shift in the sensitivity of pressure sensor 20, reflected as a shift in capacitance. As will be discussed in detail below, a test cell and seal structure are formed within, i.e., built into, a pressure sensor and are used to estimate the sensitivity of the sense cells in response to any process variation, and to ultimately calibrate the pressure sensor based on the estimated sensitivity.

A variation in width 62 is described as potentially causing a shift in the sensitivity of a pressure sensor. However, other geometric variations, such as a thickness of the pressure sensing diaphragm, the geometry of the pressure cavity, and so forth may also cause a shift in the sensitivity of a pressure sensor. Nevertheless, the built-in test cell and seal structure can be implemented within a pressure sensor to provide calibration capability regardless of the particular process variation.

Figure 4:
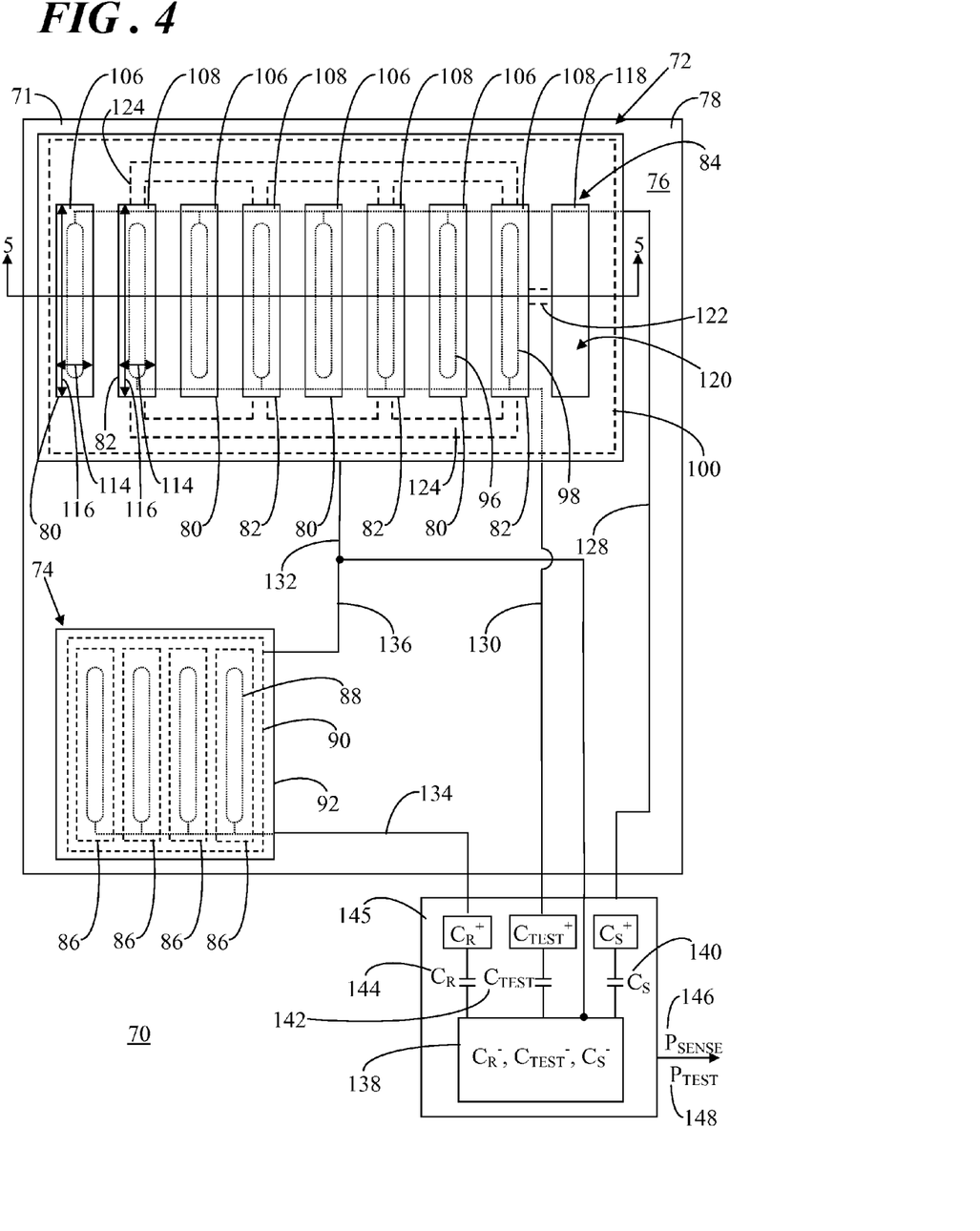
FIG. 4 shows a simplified top view of a pressure sensor in accordance with an embodiment.
Figure 5:
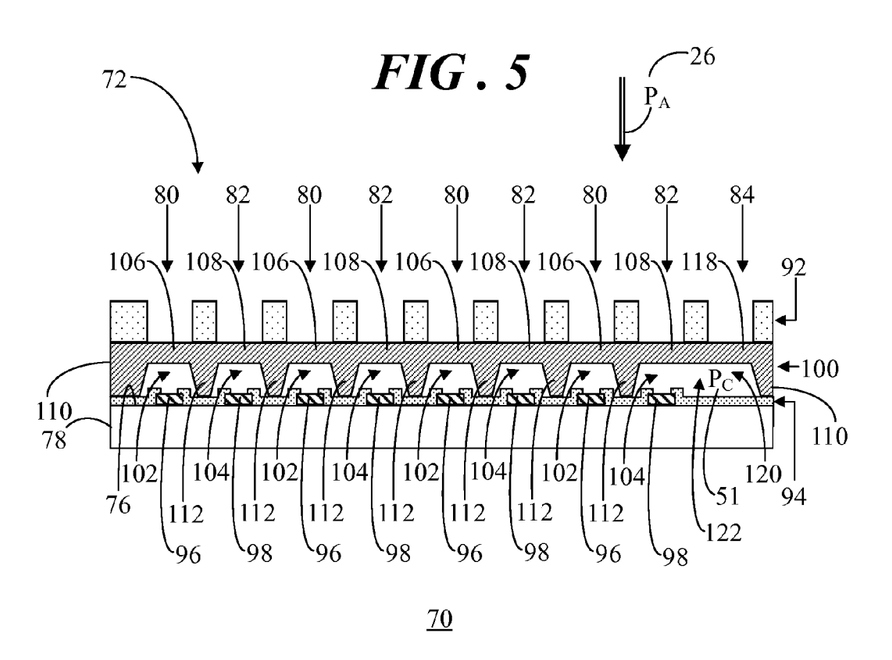
FIG. 5 shows a side sectional view of the pressure sensor along section lines 5-5 of FIG. 4.

Referring to FIGS. 4 and 5, FIG. 4 shows a simplified top view of a MEMS pressure sensor 70 in accordance with an embodiment, and FIG. 5 shows a side sectional view of pressure sensor 70 along section lines 5-5 of FIG. 4. Pressure sensor 70 generally includes a sensing assembly 71 having at least a sense structure 72 and a reference structure 74. FIG. 5 particularly shows a side sectional view of sense structure 72 of pressure sensor 70. Sense and reference structure 72 and 74 may be formed on a surface 76 of a substrate 78. Sense structure 72 includes one or more sense cells 80 and built-in calibration capability in the form of one or more test cells 82 and a seal structure 84. Test cells 82 and seal structure 84 are implemented in order to estimate the sensitivity of sense cells 80, which may vary from a design sensitivity for sense cells 80 due to, for example, process variation.

Sense cells 80 and test cells 82 of sense structure 72 are formed in proximity to one another on substrate 78. In the illustrated embodiment, sense cells 80 and test cells 82 are configured in an interleaved arrangement, i.e., an alternating arrangement of sense cells 80 with test cells 82. Sense cells 80 and test cells 82 are concurrently fabricated to have the same geometric dimensions, and the individual sense and test cells 80, 82 are sensitive to ambient pressure 26. Due to their same geometric dimensions, the sensitivity of sense and test cells 80, 82 to ambient pressure 26 is assumed to be nearly identical.

Reference structure 74 includes reference cells 86. Unlike sense and test cells 80, 82, reference cells 86 of reference structure 74 are largely insensitive to ambient pressure 26. Reference structure 74 is structurally similar to reference structure 24 shown in FIGS. 1 and 3. Accordingly, each reference cell 86 can include a reference electrode 88 formed on substrate 78, a cavity (such as cavity 46 shown in FIG. 3), and a reference electrode 90 spaced apart from reference electrodes 44 by the vacuum cavity. A cap layer 92 is formed in contact with each reference electrode 90. Again, cap layer 92 may be a relatively thick layer of, for example, tetraethyl orthosilicate (TEOS), which makes the reference electrodes 90 largely insensitive to ambient pressure 26. Further description of reference structure 74 is omitted herein for brevity since such a description of reference structure 74 would correspond with that provided for reference structure 24.

Pressure sensor 70 is illustrated in FIGS. 4 and 5 as including four sense cells 80, four test cells 82, and four reference cells 86. However, pressure sensor 70 may include any suitable quantity of sense cells 80, test cells 82, and reference cells 86. Additionally, reference structure 74 is shown as being physically separate from sense structure 72 for simplicity of illustration. In alternative embodiments, reference cells 86 of reference structure 74 may also be interleaved with sense and test cells 80, 82. In still other embodiments, sense and test cells 80, 82 need not be interleaved, but may instead be arranged in proximity to one another in other structural configurations. Pressure sensor 70 may also include other features on substrate 78 such as shield lines, a guard ring, and so forth that are not included in FIGS. 4 and 5 for simplicity of illustration.

Sense structure 72 and reference structure 74 may be fabricated on surface 76 of substrate 78. An insulating layer 94 (best seen in FIG. 5) may then be deposited on the remaining exposed surface 76 of substrate 78. Insulating layer 94 can comprise any suitable insulative or dielectric material layer, such as a nitride material, selected according to the requirements of a given pressure sensor implementation.

Each of sense cells 80 includes an electrode 96 formed on substrate 78, and each of test cells 82 includes an electrode 98 formed on substrate 78. In FIG. 4, electrodes 96 and 98 are illustrated in phantom using dotted lines, due to their location beneath a structural layer 100. Likewise, reference electrodes 88 of reference structure 74 are also illustrated in phantom using dotted lines, due to their location beneath reference electrode 90 and cap layer 92. FIG. 5 is illustrated using various shading and/or hatching to distinguish the different elements produced within the structural layers of the devices, as will be discussed below. These different elements within the structural layers may be produced utilizing current and upcoming surface micromachining techniques of depositing, patterning, etching, and so forth. Accordingly, although different shading and/or hatching may be utilized in the illustrations, the different elements within the structural layers can be formed out of the same material, such as polysilicon, single crystal silicon, and the like.

Electrodes 96 represent a set of sense capacitor bottom plate electrodes for sense cells 80, while electrodes 98 represent another set of sense capacitor bottom plate electrodes for test cells 82. Since test cells 82 are interleaved with sense cells 80, electrodes 96 are correspondingly configured in an interleaved arrangement with electrodes 98. In some embodiments, a geometry of individual electrodes 96 matches a geometry of individual electrodes 98, i.e., the geometries are substantially identical.

Referring still to sense structure 72, structural layer 100 represents a capacitor top plate electrode for each of sense cells 80 and test cells 82, respectively. Structural layer 100 is overlying, spaced apart from, and configured in connection with electrodes 96 and 98, to produce sense cavities 102 for sense cells 80 and test cavities 104 for test cells 82 (see particularly FIG. 5). Test cavities 104 of test cells 82 are laterally spaced apart from and physically isolated from sense cavities 102 of sense cells 80. Cavities 102 and 104 may be vacuum chambers having initial cavity pressure 51 of approximately vacuum. Alternatively, cavities 102 and 104 are chambers initially filled with a suitable gas during fabrication at a given controlled pressure, which is therefore referred to herein as initial cavity pressure 51.

Structural layer 100 anchors to the surface of insulating layer 94 for defining portions of structural layer 100 corresponding to sense diaphragms 106 for sense cells 80 and for defining other portions of structural layer 100 corresponding to test diaphragms 108 for test cells 82. For example, structural layer 100 anchors to insulating layer 94 about a perimeter 110 of structural layer 100 and at desired anchor locations internal to the perimeter, such as indicated by reference numerals 112, to establish cavities 102 and 104 and to distinguish sense diaphragms 106 from test diaphragms 108.

In general, an area of each of sense diaphragms 106 is formed to be geometrically equal to an area of each of test diaphragms 108. For example, each of sense and test diaphragms 106 and 108 is characterized by a width 114 and a length 116, in which width 114 of each sense diaphragm 106 is generally equivalent to width 114 of each test diaphragm 108 and length 116 of each sense diaphragm 106 is generally equivalent to length of each test diaphragm 108. Since the geometric characteristics of sense and test diaphragms 106, 108 (e.g., width 114 and length 116) are equal, it follows that the area of each of sense and test diaphragms 106 and 108 is equivalent, and therefore the sensitivity of each test cell 82 is ideally identical to the sensitivity of each sense cell 80. Accordingly, in the illustrated embodiment, widths 114 and length 116 are critical dimensions that directly affect the sensitivity of sense cells 80 and test cells 82, respectively.

Pressure sensor 70 is illustrated with generally rectangular diaphragms having a width that is less than a length of the rectangular diaphragms. However, the diaphragms need not be rectangular, but may instead be other shapes (e.g., squares, circles, multi-sided elements, and so forth) as long as the geometric characteristics of sense and test diaphragms 106, 108 are the same so that the sensitivity of sense cells 80 and test cells 82 is generally the same.

Referring now to seal structure 84, seal structure 84 includes a seal membrane 118 spaced apart from the underlying substrate 78 so that a seal cavity 120 is produced between seal membrane 118 and substrate 78. In an embodiment, seal membrane 118 may be a portion of structural layer 100 that anchors to substrate 78 about a perimeter of seal cavity 120. Seal structure 84 further includes a channel 122 interposed between at least one of test cavities 104 and seal cavity 120. In FIG. 4, channel 122 is represented by dashed lines between a rightmost test cell 82 and seal structure 84 since it is obscured by the overlying structural layer 100, and in some locations, by a portion of the cap layer 92. In the cross-sectional illustration of FIG. 5, channel 122 is shown interconnecting test cavity 104 of the rightmost test cell 82 and seal cavity 120 of seal structure 84.

A channel structure 124 additionally interconnects each of text cavities 104. Channel structure 124 is also represented by dashed lines in FIG. 4 since it is obscured by the overlying structural layer 100, and in some locations by a portion of the cap layer 92. Thus, seal structure 84 which includes channel 122 and channel structure 124 results in a configuration in which each of test cavities 104 is in fluid communication with seal cavity 120.

Figure 6:
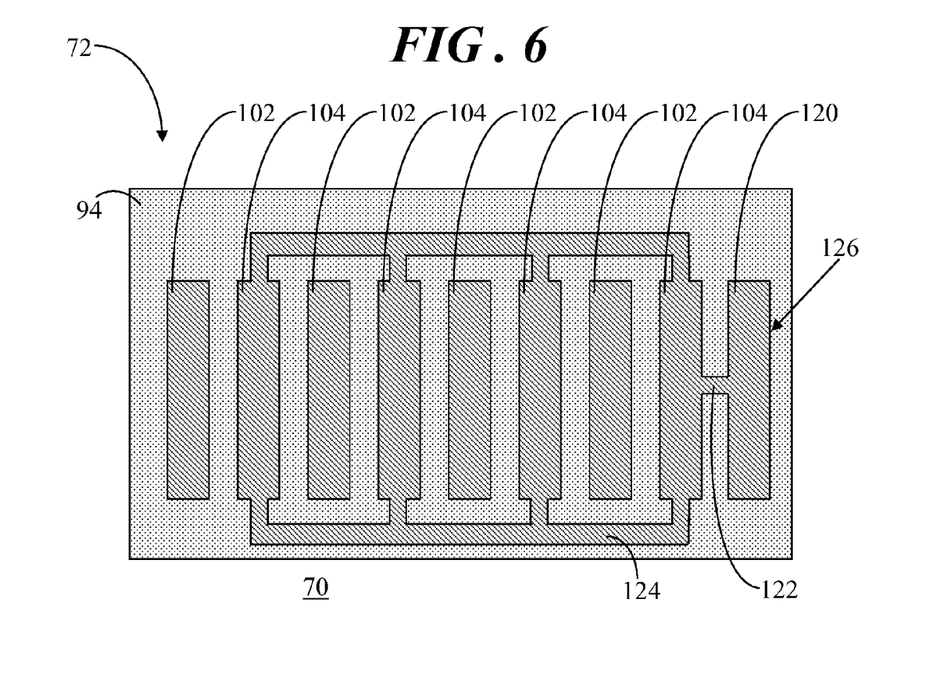
FIG. 6 shows a partial top view of the pressure sensor of FIG. 4 at an intermediate stage of processing.

Referring to FIG. 6 in connection with FIGS. 4 and 5, FIG. 6 shows a partial top view of pressure sensor 70 at an intermediate stage of processing. In particular, FIG. 6 shows a top view of sense structure 72 of pressure sensor 70 at the intermediate stage of fabrication. In accordance with MEMS fabrication methodologies, sense electrodes 96, test electrodes 98, and reference electrodes 88 (none of which are visible), and insulating layer 94 may be formed on surface 76 of substrate 78. A sacrificial material layer 126, such as, polysilicate glass (PSG), may then be deposited across sense electrodes 96, test electrodes 98, and reference electrodes 88, and a surface of insulating layer 94. For clarity, insulating layer 94 is represented by a stippled pattern and sacrificial material layer 126 is represented by downwardly and rightwardly directed narrow hatching.

Sacrificial layer 126 is suitably patterned and etched by conventional processes to form those regions that will become hollow spaces in the resulting MEMS pressure sensor 70. In other words, following sacrificial layer patterning and etching, structural layer 100 can be deposited over any sacrificial material layer 126 that remains on insulating layer 94 as well as over any exposed regions of insulating layer 94. This remaining sacrificial material layer 126 can be removed following deposition of structural layer 100 via conventional practices to produce hollow regions in MEMS pressure sensor 70, namely, sense cavities 102, test cavities 104, seal cavity 120, channel 122, and channel structure 124.

Sense cavities 102, test cavities 104, seal cavity 120, channel 122, and channel structure 124 are labeled in FIG. 6 for illustrative purposes. Recall that deposition of structural layer 100 and removal of sacrificial material layer 126 has not yet occurred. Nevertheless, the configuration of sacrificial material layer 126 in FIG. 6 reveals that channel 122 and channel structure 124 will interconnect each of test cavities 104 with seal cavity 120. Conversely, sense cavities 102 will remain physically isolated from test cavities 104 and seal cavities 120.

As will be discussed in greater detail below, each of sense cavities 102, test cavities 104, seal cavity 120, channel 122, and channel structure 124 are fabricated in an environment such that they will all have the same initial cavity pressure 51), such as approximately vacuum. However, seal membrane 118 is configured to be breached. When seal membrane 118 is breached, test cavities 104 are "opened" due to their interconnection with seal cavity 120 via channel 122 and channel structure 124. Thus, when seal membrane 118 is breached, the pressure inside of test cavities 104 changes from initial cavity pressure 51 to ambient pressure 26. This change in pressure within test cavities 104 is exploited by taking pressure measurements from test cells 82 before breaching seal membrane 118 and after the pressure within test cavities 104 normalizes to ambient pressure 26. These pressure measurements can be used to calculate the sensitivity of test cells 82, and due to their proximity and equivalent geometric characteristics, the sensitivity of test cells 82 can be used to estimate the sensitivity of sense cells 80.

Referring in particular to FIG. 4, MEMS pressure sensor 70 further includes a conductive runner 128 electrically coupled to electrodes 96 to provide electrical access to electrodes 96 external to sense cells 80 of sense structure 72. Another conductive runner 130 is electrically coupled to electrodes 98 to provide electrical access to electrodes 98 external to test cells 82. Additionally a conductive runner 132 is electrically coupled to structural layer 100 of sense structure 72 so as to form a common electrode for sense structure 72. A conductive runner 134 is also electrically coupled to reference electrodes 88 to provide electrical access to reference electrodes 88 external to reference cells 86 of reference structure 74. Another conductive runner 136 is electrically coupled to reference electrode 90 so as to form a common electrode for reference structure 74. It should be observed in FIG. 4 that portions of conductive runners 128, 130, and 134 are illustrated in phantom using dotted lines, due to their location beneath structural layer 100, reference electrode 90, and/or cap layer 92. In an embodiment, conductive runner 132 for sense structure 72 and conductive runner 136 for reference structure 24 are interconnected to form a common node 138 between sense structure 72 and reference structure 74.

In general, sense cells 80 form a capacitor between sense diaphragms 106 and electrodes 96. That is, a sense signal, referred to herein as a sense capacitance signal 140, and labeled $C_S$ in FIG. 4, is produced between sense diaphragms 106 and electrodes 96 (i.e., the difference between $C_S^+$ and $C_S^-$) that varies in response to ambient pressure 26. Likewise, test cells 82 form a capacitor between test diaphragms 108 and electrodes 98. That is, a test signal, referred to herein as a test capacitance signal 142, and labeled $C_{TEST}$ in FIG. 4, is produced between test diaphragms 108 and electrodes 98 (i.e., the difference between $C_{TEST}^+$ and $C_{TEST}^-$) that is also responsive to ambient pressure 26. Reference cells 86 also form a capacitor between each of reference electrode 90 and reference electrodes 88. Thus, a reference capacitance signal 144, and labeled $C_R$ in FIG. 4, is formed between electrode 90 and reference electrodes 88 (i.e., the difference between $C_R^+$ and $C_R^-$). However, reference capacitance signal 144 does not vary in response to ambient pressure 26 due to the presence of cap layer 92.

A control circuit 145 is configured to measure the ratio of sense capacitance signal 140 to reference capacitance signal 144 (i.e., $C_S/C_R$). Higher ambient pressure 26 causes greater deflection of sense diaphragms 106, and this greater deflection increases sense capacitance signal 144, $C_S$, but has little effect on reference capacitance signal 144, $C_R$. Therefore the ratio of sense capacitance signal 144 to reference capacitance signal 144 (i.e., $C_S/C_R$) increases as ambient pressure 26 increases. This value can be converted into a sense signal 146, labeled $P_{SENS}$ in FIG. 4, i.e., a measure indicative of ambient pressure 26 sensed by sense cells 80. Control circuit 145 may also be configured to measure the ratio of test capacitance signal 142 to reference capacitance signal 144 (i.e., $C_{TEST}/C_R$) and convert this value into a test signal 148, labeled $P_{TEST}$ in FIG. 4, i.e., a measure indicative of ambient pressure 26 sensed by test cells 82.

Figure 7:
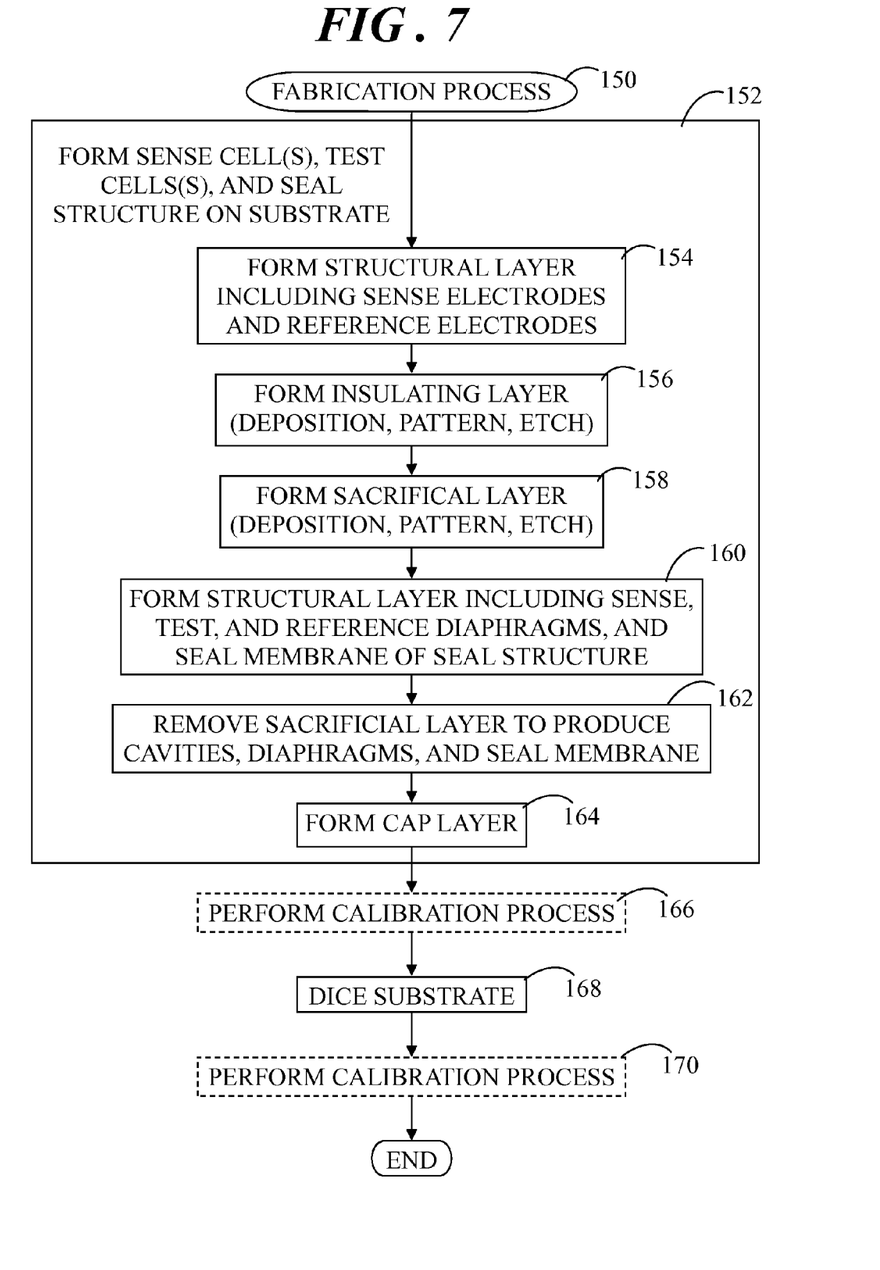
FIG. 7 shows a flowchart of a fabrication process in accordance with another embodiment.

FIG. 7 shows a flowchart of a fabrication process 150 in accordance with another embodiment. In an embodiment, sense structure 72 and reference structure 74 are formed concurrently on a common substrate. More crucially, sense cells 80 and test cells 82 are formed concurrently on the same substrate, and sense cells 80 and test cells 82 are fabricated have the same geometric characteristics. Accordingly, any process variation that affects sense cells 80 should affect test cells 82 similarly. Pressure sensor 70 may be fabricated using the surface micromachining processes of thin film deposition, patterning, and etching in order to form elements in structural layers and sacrificial layers that are used to define gaps, or cavities, between the elements in the structural layers.

Fabrication process 150 begins with a series of operations generally referred to as a subprocess 152 of forming one or more pressure sensors 70 on the same substrate 78. More particularly, subprocess 152 entails forming sense cells 80, test cells 82, seal structure 84, and reference cells 86 for each pressure sensor 70 on substrate 78 (FIG. 4). The ensuing fabrication methodology will describe the fabrication of a single pressure sensor 70 for simplicity. Of course, those skilled in the art will readily recognize that multiple pressure sensors 70 may be fabricated on a common substrate simultaneously in accordance with known batch process techniques.

Operations of subprocess 152 include a task 154 at which a structural layer is formed on substrate 78 to include sense electrodes 96 of sense cells 80, test electrodes 98 of test cells 82, and reference electrodes 88 of reference cells 86 (FIG. 4). These structures may be formed utilizing known and upcoming deposition, patterning, and etching processes. Subprocess 152 continues with a task 156 in which insulating layer 94 (FIG. 5) is suitably formed over substrate 78 utilizing, for example, deposition, patterning, and etching processes.

Following task 156, a task 158 is performed. At task 158, sacrificial layer 126 (FIG. 6) is formed over insulating layer 94 and the exposed sense electrodes 96 of sense cells 80, test electrodes 98 of test cells 82, and reference electrodes 88 of reference cells in accordance with known deposition, patterning, and etching processes. Subprocess 152 continues with a task 160. At task 160, structural layer 100 (FIG. 5) is formed to include sense diaphragms 106, test diaphragms 108, reference electrodes 90, and seal membrane 118 of seal structure 84 (see FIGS. 4 and 5).

Next at a task 162, sacrificial layer 126 may be removed via etch openings (such as etch openings 42 shown in FIG. 1) as known to those skilled in the art. Thus, following task 162, sense cavities 102 of sense cells 80, test cavities 104 of test cells 82, seal cavity 120 of seal structure 84, reference cavities of reference cells 86, channel 122, and channel structure 124 are produced as discussed above in connection with FIG. 6. Subprocess 152 continues with a task 164. At task 164, cap layer 92 (FIGS. 4 and 5) is formed by, for example, deposition of TEOS so that it is in contact with reference electrodes 88 and is in contact with structural layer 100 in the regions between sense and test diaphragms 106, 108, respectively. However, cap layer 92 is not in contact with sense and test diaphragms 106, 108 and seal membrane 118.

A MEMS pressure sensor is typically fabricated so that the pressure within its cavity is below atmospheric pressure, and more particularly near vacuum. Accordingly, subprocess 152 may be performed under vacuum conditions so that initial cavity pressure 51 (FIG. 5) within each of sense cavities 102, test cavities 104, seal cavity 120, the reference cavities of reference cells 86, channel 122, and channel structure 124 is significantly less than ambient or atmospheric pressure. For example, following removal of sacrificial material layer 126, sense cavities 102, test cavities 104, seal cavity 120, the reference cavities of reference cells 86, channel 122, and channel structure 124 may be evacuated via their etch openings (such as etch openings 42 shown in FIG. 1). Accordingly, deposition of cap layer 92 may subsequently seal the etch openings so that initial cavity pressure 51 of sense cavities 102, test cavities 104, seal cavity 120, the reference cavities of reference cells 86, channel 122, and channel structure 124 remains at approximately vacuum.

The exemplary process described can produce cavities in which initial cavity pressure 51 is at approximately vacuum. Those skilled in the art will recognize that there are variety of MEMS processing techniques that can yield cavities having an initial cavity pressure at approximately vacuum. Furthermore, those skilled in the art will recognize that initial cavity pressure 51 need not be at vacuum, but may instead be another suitable pressure in accordance with particular design parameters for pressure sensor 70.

Following task 164, the fabrication of pressure sensor 70 (FIG. 4) in accordance with subprocess 152 is generally complete. However, those skilled in the art will recognize that various additional operations may be performed to fabricate pressure sensor 70. These various additional operations are omitted herein for clarity of illustration.

Following task 164 of subprocess 152, fabrication process 150 may continue with a task 166. At task 166, a pressure sensor calibration process may be performed. The calibration process will be discussed in detail in connection with FIG. 9. The task block for task 166 is illustrated by dashed lines to indicate that it may or may not be performed immediately following the execution of subprocess 152. In some embodiments, task 166 may be performed immediately following subprocess 152 and prior to a subsequent dicing, or singulation, task 168. If task 166 is performed prior to dicing task 168 at probe testing, the determined values could be saved in a database (not shown) which can then be retrieved at final testing.

Accordingly, following subprocess 152 or task 166, fabrication process 150 continues with task 168. At task 168, substrate 78 in the form of, for example, a wafer containing multiple pressure sensors 70 is diced into individual pressure sensors 70.

Following task 168, a task 170 may be performed at which the calibration process (FIG. 9) may be performed. The task block for task 170 is again illustrated by dashed lines to indicate that it may or may not be performed immediately following the execution of dicing task 168. In some embodiments, task 170 may be performed following dicing task 168 at final test in lieu of task 166 in accordance with particular test requirements and procedures. Following task 170, fabrication process 100 ends. Again, those skilled in the art will recognize that various additional operations may be performed following dicing task 168 or task 170, which are omitted herein for clarity of illustration.

Figure 8:
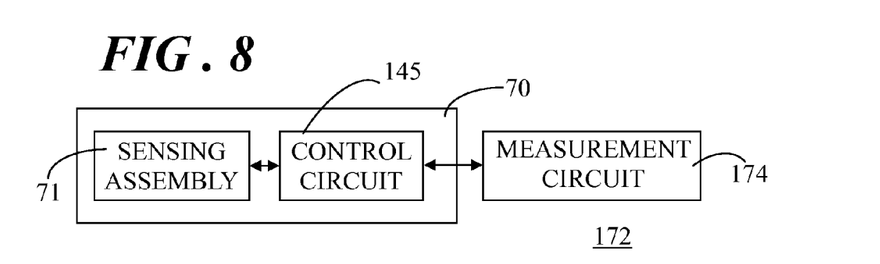
FIG. 8 shows a simplified block diagram of a test configuration for estimating a sensitivity of the pressure sensor of FIG. 4.

FIG. 8 shows a simplified block diagram of a test configuration 172 for estimating a sensitivity of the pressure sensor of FIG. 4. Test configuration 172 includes an at least partially packaged pressure sensor 70 having sensing assembly 71 and control circuit 145. Pressure sensor 70 is electrically coupled with a measurement circuit 174. In general, measurement circuit 174 is configured to receive output signals from pressure sensor 70, calculate a sensitivity of test cells 82 (FIG. 4), and estimate a sensitivity of sense cells 80 (FIG. 4) based on the calculated sensitivity of test cells 82. Measurement circuit 174 may then compute calibration coefficients for pressure sensor 70 in response to the estimated sensitivity of sense cells. These calibration coefficients may be communicated to control circuit 145 of pressure sensor 70 where then can be utilized to calibrate pressure sensor 70.

Test configuration 172 can have many forms and can be implemented using a multiplicity of systems to act as measurement circuit 174 in accordance with a particular industrial test environment. For example, measurement circuit 174 may be implemented as a wafer probe system to measure the sensitivity of and calibrate pressure sensor 70 prior to device singulation (e.g., at task 166 of fabrication process 150 shown in FIG. 7). Alternatively, measurement circuit 174 may be implemented as measurement control unit (MCU) circuit to measure the sensitivity of and calibrate pressure sensor 70 after packaging, but before gel fill (e.g., at task 170 of fabrication process 150 shown in FIG. 7). Furthermore, such an industrial test environment may be adapted to concurrently test and calibrate a plurality of pressure sensors 70. Regardless of the particular test environment, the sensitivity of pressure sensor 70 can be estimated and calibration parameters may be calculated without imposition of a physical stimulus calibration signal.

Figure 9:
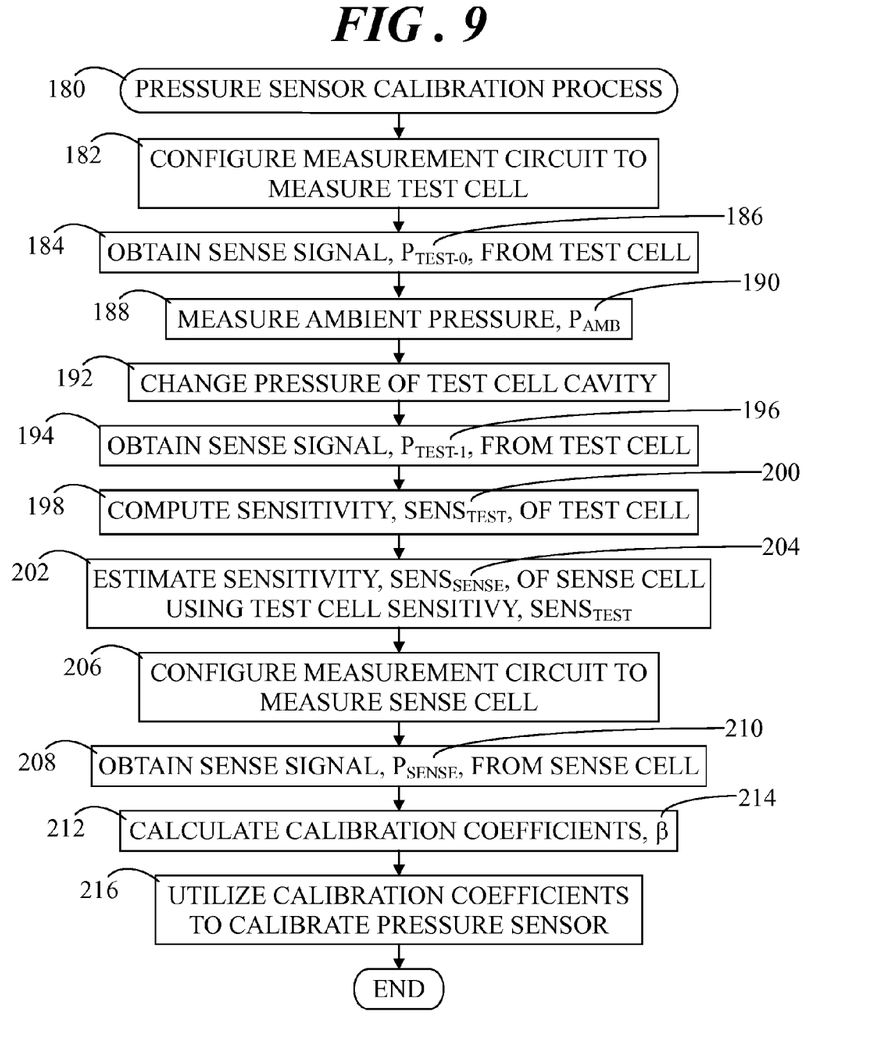
FIG. 9 shows a flowchart of a calibration process in accordance with another embodiment.

FIG. 9 shows a flowchart of a pressure sensor calibration process 180 in accordance with another embodiment. Pressure sensor calibration process 180 is performed to estimate the sensitivity of sense cells 80 of pressure sensor 70 using test cells 82 (FIG. 4). The estimated sensitivity may then be utilized to calculate calibration coefficients specific to the pressure sensor 70 being tested. Calibration process 180 may be executed within test environment 172 (FIG. 8) using measurement circuit 174 (FIG. 8), and can be performed under ambient pressure conditions, e.g., standard atmospheric pressure, without imposing a physical pressure calibration stimulus in excess of ambient pressure.

Calibration process 180 begins with a task 182. At task 182, measurement circuit 174 is configured to measure, i.e., take pressure readings from, test cells 82. That is, measurement circuit 174 is configured to receive test signal, $P_{TEST}$, 148 (FIG. 4).

Calibration process 180 continues with a task 184. At task 184, ambient pressure 26 (FIG. 5) is detected at test cells 82 of pressure sensor 70, and measurement circuit 174 obtains test signal 148 (FIG. 4) indicative of ambient pressure 26. This initial test signal 148 is represented in FIG. 9 by a raw test signal, $P_{TEST-0}$ 186. Since test cells 82 have a vacuum reference, i.e., initial cavity pressure 51 (FIG. 5) at approximately vacuum, the net applied pressure on test diaphragms 108 (FIG. 5) of test cells 82 will be ambient pressure 26, for example, approximately 100 kPa.

A task 188 is performed in connection with task 184. At task 188, ambient pressure 26 is measured in the location at which pressure sensor 70 is being tested. Ambient pressure 26 may be measured using any suitable and highly accurate pressure measurement device. This ambient pressure measurement is represented in FIG. 9 by an ambient pressure measurement, $P_{AMB}$ 190.

Process 180 continues with a task 192. At task 192, initial cavity pressure 51 (FIG. 5) within test cavities 104 of test cells 82 is changed to ambient pressure 26. In an embodiment, task 192 may be accomplished by breaching seal membrane 118 of seal structure 84 (FIG. 5). Techniques for breaching seal membrane 118 can include mechanically cracking seal membrane 118, using a laser to drill an opening in seal membrane 118, or burning a metal or polysilicon fuse in seal membrane 118.

Yet another technique may be to form multiple pressure sensors 70 on a wafer substrate, with each seal structure 84 being physically located in the saw street of the wafer substrate. Accordingly, tasks 182, 184, and 188 of calibration process 180 may be executed prior to dicing operation 168 of fabrication process 150 (FIG. 7). Task 192 may be executed concurrently with dicing operation 168. As such, seal membrane 118 can be breached when the wafer substrate is diced. The remaining operations of calibration process 180 may be performed following dicing operation 168.

Regardless of the particular technique implemented, when seal membrane 118 is breached at task 192, air or another suitable gas at ambient pressure 26 flows through the breach in seal membrane 118 and into seal cavity 120 (FIG. 5). The air or other suitable gas flows from seal cavity 120 through channel 122 and channel structures 124 into each of test cavities 104 (FIG. 5) until the pressure in test cavities 104 normalizes, i.e., changes, to ambient pressure 26. However, the cavity pressure within sense cavities 102 remains at initial cavity pressure 51 (FIG. 5), e.g., at vacuum, since sense cavities 102 are physically isolated from test cavities 104, seal cavity 120, channel 122 and channel structure 124.

Following task 192, calibration process 180 continues with a task 194. At task 194, measurement circuit 174 again obtains test signal 148 (FIG. 4). This test signal 148 following breach of seal membrane 118 (FIG. 5) is represented in FIG. 9 by a raw test signal, $P_{TEST-1}$ 196. Since test cavities 104 of test cells 82 now have a pressure equivalent to ambient pressure 26, the net applied pressure on test diaphragms 108 (FIG. 5) of test cells 82 will be approximately 0 kPa.

A task 198 is performed following task 194. At task 198, a sensitivity of test cells 82 to ambient pressure 26 may be computed by measurement circuit 174 using raw test signal, $P_{TEST-0}$ 186, before breaching seal membrane 118 and using raw test signal, $P_{TEST-1}$ 196, after seal membrane 118 is breached. The computed sensitivity of test cells 82 is represented in FIG. 9 by a test cell sensitivity value, $SENS_{TEST}$ 200. Calculation of the sensitivity of test cells 82 is exemplified by the following equation:

$$SENS_{TEST}=(P_{TEST-0}-P_{TEST-1})/P_{AMB} \quad (1)$$

where $P_{TEST-0}$ is raw test signal 186 prior to breaching seal membrane 118, $P_{TEST-1}$ is raw test signal 196 following breach of seal membrane 118, $P_{AMB}$ is ambient pressure measurement 190, and $SENS_{TEST}$ is test cell sensitivity 200.

Following task 198, calibration process 180 continues with a task 202. At task 202, measurement circuit 174 estimates the sensitivity of sense cells 80 (FIG. 5) using test cell sensitivity 200. In an embodiment, the sensitivity of sense cells 80 is approximately equivalent to test cell sensitivity 200 due to their equivalent geometric parameters and their concurrent fabrication using the same semiconductor fabrication processes. The estimated sensitivity of sense cells 80 is represented in FIG. 9 by a sense cell sensitivity, $SENS_{SENSE}$ 204. This approximate equality may be exemplified by the following equation:

$$SENS_{SENSE} \approx SENS_{TEST} \quad (2)$$

In practice, however, there may be deviations from the ideal that may call for the inclusion of one or more scaling constants, $C_0$, and/or other terms. Consequently, the estimated sense cell sensitivity 204 may more accurately be estimated by the following exemplary equation:

$$SENS_{SENSE}=C_0*SENS_{TEST} \quad (3)$$

Following estimation task 202, the estimated sense cell sensitivity 204 is utilized to calculate calibration coefficients for pressure sensor 70. Accordingly, calibration process 180 continues with a task 206. At task 206, measurement circuit 174 (FIG. 8) is configured to measure, i.e., take pressure readings from, sense cells 80 (FIG. 5). That is, measurement circuit 174 is configured to receive sense signal 146 (FIG. 4).

Process 180 continues with a task 208. At task 208, ambient pressure 26 (FIG. 5) is detected at sense cells 80 of pressure sensor 70, and measurement circuit 174 obtains sense signal 146 (FIG. 4) indicative of ambient pressure 26. This sense signal 146 is represented in FIG. 9 by a raw sense signal, $P_{SENSE}$ 210. Since sense cavities 102 of sense cells 80 have a vacuum reference, i.e., initial cavity pressure 51 (FIG. 5) at approximately vacuum, the net applied pressure on sense diaphragms 106 (FIG. 4) of sense cells 80 will be ambient pressure 26, for example, approximately 100 kPa.

Following task 208, calibration process 180 continues with a task 212. At task 212, measurement circuit 174 calculates calibration coefficients for sense cells 80. These calibration coefficients may be calculated in a known manner as a function of raw sense signal 210, sense cell sensitivity 204, and ambient pressure measurement 190. The calibration coefficients are represented in FIG. 9 by β 214. The calculation of calibration coefficients 214 can be characterized by the following exemplary function:

$$\beta = f(P_{SENSE}, SENS_{SENSE}, P_{AMB}) \quad (4)$$

It should be observed from the above presented discussion that sense cell sensitivity 204, $SENS_{SENSE}$, is estimated in response to the calculated test cell sensitivity 200, $SENS_{TEST}$. It follows, therefore, that calibration coefficients 214 for sense cells 80 are determined in response to test cell sensitivity 200.

Following the determination of calibration coefficients 214 at task 212, calibration process 180 continues with a task 216. At task 216, calibration coefficients 214 are utilized to calibrate pressure sensor 70. For example, calibration coefficients 214 may be stored in association with control circuit 145 so that calibration coefficients 214 can be applied when processing sense capacitance 140 (FIG. 4) to produce a calibrated sense signal 146. Following task 216, calibration process 180 ends.

Thus, through the inclusion of seal structure 84 and test cells 82 as part of sense structure 72 (FIG. 4), and the associated execution of pressure sensor calibration process 180, sensitivity 204 of sense cells 80 of pressure sensor 70 can be readily estimated utilizing a computed sensitivity 200 of test cells 82. Calibration coefficients 214 specific to pressure sensor 70 under test can then be applied to calibrate pressure sensor 70 to cancel out incongruities resulting from process variation.

In summary, embodiments entail a MEMS pressure sensor that includes built-in calibration capability, methodology for fabricating the MEMS pressure sensor, and methodology for estimating the sensitivity of and calibrating the MEMS pressure sensor. The pressure sensor includes multiple sense and test cells on a single die which are fabricated with the same geometric characteristics and processes. Therefore, each of the sense and test cells ideally has the same sensitivity to an imposed pressure stimulus. A seal structure is in communication with one or more test cavities of one or more test cells. The seal structure is configured to be breached to change the pressure within the test cavities. A sensitivity of the test cells can be measured by taking pressure readings before and after breaching the seal structure. Since the test and sense cells are assumed to have the same sensitivity, sense signals from the test cells may be utilized to estimate the sensitivity of the sense cells. The estimated sensitivity of the sense cells may subsequently be utilized to calculate calibration coefficients and to ultimately calibrate the pressure sensor. Such a pressure sensor and methodology can enable sensitivity estimation and associated sensor calibration without imposing a physical stimulus calibration signal thereby reducing test and equipment costs.

It is to be understood that certain ones of the process blocks depicted in FIGS. 7 and 9 may be performed in parallel with each other or with performing other processes. In addition, it is to be understood that the particular ordering of the process blocks depicted in FIGS. 7 and 9 may be modified, while achieving substantially the same result. Accordingly, such modifications are intended to be included within the scope of the inventive subject matter. In addition, although particular system configurations are described in conjunction with FIGS. 4-6, above, embodiments may be implemented in systems having other architectures, as well. These and other variations are intended to be included within the scope of the inventive subject matter.

While the principles of the inventive subject matter have been described above in connection with specific apparatus and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A microelectromechanical systems (MEMS) pressure sensor comprising:
    a sense cell; and
    a test cell, said sense and test cells being formed in proximity to one another on a common substrate, said test cell having a test cavity and a seal structure in communication with said test cavity, wherein each of said sense and test cells is sensitive to ambient pressure, said test cavity exhibits an initial cavity pressure when said seal structure is unbreached, and when said seal structure is breached said initial cavity pressure is changed to said ambient pressure, wherein said seal structure comprises a seal membrane spaced apart from said underlying substrate to produce a seal structure cavity and a channel interposed between said test cavity and said seal structure cavity, and said seal membrane is breached to change said initial cavity pressure within said test cavity to said ambient pressure.

2. A MEMS pressure sensor as claimed in claim 1 wherein said ambient pressure is atmospheric pressure, and said test cell is utilized to estimate a sensitivity of said sense cell without application of a pressure stimulus that is greater than said atmospheric pressure.

3. A MEMS pressure sensor as claimed in claim 1 further comprising;
    a signal line in communication with said test cell;
    said test cell is configured to produce a first sense signal via said signal line in response to said ambient pressure prior to said seal structure being breached; and
    said test cell is configured to produce a second sense signal via said signal line after said seal structure is breached.

4. A MEMS pressure sensor as claimed in claim 1 wherein said sense cell includes a sense cavity, and each of said sense and test cavities exhibits said initial cavity pressure prior to said seal structure being breached.

5. A MEMS pressure sensor as claimed in claim 4 wherein said initial cavity pressure is at approximately vacuum.

6. A MEMS pressure sensor as claimed in claim 1 wherein said sense cell includes a sense cavity, and said test cavity is physically isolated from said sense cavity of said sense cell.

7. A MEMS pressure sensor as claimed in claim 1 wherein:
said sense cell includes a sense diaphragm overlying and spaced apart from said substrate to produce a sense cavity; and
said test cell includes a test diaphragm overlying and spaced apart from said substrate to produce said test cavity, wherein said sense diaphragm, said test diaphragm, and said seal membrane are formed in a common structural layer.

8. A MEMS pressure sensor as claimed in claim 1 further comprising:
a set of sense cells formed on said substrate, said set of sense cells including said sense cell; and
a set of test cells formed on said substrate, said set of test cells including said test cell.

9. A MEMS pressure sensor as claimed in claim 8 wherein said set of test cells is configured in an interleaved arrangement with said set of sense cells.

10. A MEMS pressure sensor as claimed in claim 8 wherein each of said test cells within said set of test cells has said test cavity and said seal structure is in communication with each said test cavity, such that said initial cavity pressure within said each test cavity changes to said ambient pressure when said seal structure is breached.

11. A method comprising:
forming a sense cell of a microelectromechanical systems (MEMS) pressure sensor on a substrate, said sense cell having a sense cavity;
forming a test cell of said MEMS pressure sensor on said substrate in proximity to said sense cell, said test cell having a test cavity, each of said sense and test cavities exhibiting an initial cavity pressure, said test cavity being physically isolated from said sense cavity, and each of said sense and test cells being sensitive to ambient pressure; and
forming a seal structure in communication with said test cavity, wherein said seal structure is configured to be breached to change said initial cavity pressure within said test cavity to said ambient pressure, with said sense cavity remaining at said initial cavity pressure, wherein said forming said seal structure comprises:
forming a seal membrane overlying and spaced apart from said substrate to produce a seal structure cavity; and
forming a channel interposed between said test cavity and said seal structure cavity.

12. A method as claimed in claim 11 wherein:
said forming said sense cell includes forming a sense diaphragm overlying and spaced apart from said substrate to produce said sense cavity; and
said forming said test cell includes forming a test diaphragm overlying and spaced apart from said substrate to produce said test cavity, wherein said sense diaphragm, said test diaphragm, and said seal membrane are formed in a common structural layer.

13. A method as claimed in claim 11 further comprising:
obtaining a first sense signal between an electrode and a test diaphragm of said test cell in response to said ambient pressure;
breaching said seal membrane to change said initial cavity pressure within said test cavity to said ambient pressure; and
obtaining a second sense signal between said electrode and said test diaphragm following said breaching operation.

14. A method as claimed in claim 13 further comprising:
computing a test cell sensitivity of said test cell using said first and second sense signals; and
estimating a sensitivity of said sense cell using said test cell sensitivity.

15. A method comprising:
obtaining a first sense signal between a sense electrode and a test diaphragm of a test cell of a microelectromechanical systems (MEMS) pressure sensor in response to an ambient pressure, wherein said test cell includes a test cavity in which said sense electrode is located, said test cavity exhibiting an initial cavity pressure;
changing said initial cavity pressure within said test cavity to said ambient pressure, wherein said changing operation leaves said test diaphragm intact; and
obtaining a second sense signal between said sense electrode and said test diaphragm following said changing operation.

16. A method as claimed in claim 15 wherein a sense cell of said MEMS pressure sensor and said test cell are formed on a substrate in proximity to one another, and said changing operation does not change said initial cavity pressure within a sense cavity of said sense cell to said ambient pressure.

17. A method comprising:
obtaining a first sense signal between a sense electrode and a test diaphragm of a test cell of a microelectromechanical systems (MEMS) pressure sensor in response to an ambient pressure, wherein said test cell includes a test cavity in which said sense electrode is located, said test cavity exhibiting an initial cavity pressure;
changing said initial cavity pressure within said test cavity to said ambient pressure;
obtaining a second sense signal between said sense electrode and said test diaphragm following said changing operation;
computing a test cell sensitivity of said test cell using said first and second sense signals; and
estimating a sensitivity of a sense cell of said MEMS pressure sensor using said test cell sensitivity, wherein said ambient pressure is atmospheric pressure, and said estimating operation is performed without application of a pressure stimulus that is greater than said atmospheric pressure.

* * * * *